United States Patent
Choi et al.

(10) Patent No.: US 7,755,100 B2
(45) Date of Patent: Jul. 13, 2010

(54) PACKAGING APPARATUS OF TERAHERTZ DEVICE

(75) Inventors: Sang Kuk Choi, Daejeon (KR); Kwang Yong Kang, Daejeon (KR); Mun Cheol Paek, Daejeon (KR); Min Hwan Kwak, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/176,867

(22) Filed: Jul. 21, 2008

(65) Prior Publication Data

US 2009/0152699 A1      Jun. 18, 2009

(30) Foreign Application Priority Data

Dec. 12, 2007   (KR) ................. 10-2007-0128991

(51) Int. Cl.
H01L 29/22    (2006.01)
H01L 33/00    (2006.01)
H01L 29/227   (2006.01)
H01L 31/0203  (2006.01)

(52) U.S. Cl. .................... 257/99; 257/95; 257/98; 257/433; 257/434; 257/E33.056; 257/E33.057; 257/E33.058; 257/E33.068; 257/E33.073

(58) Field of Classification Search .......... 257/95, 257/98, E33.056, E33.057, E33.058, E33.068, 257/E33.073, 99, 433–434
See application file for complete search history.

(56) References Cited

U.S. PATENT DOCUMENTS

| | | | |
|---|---|---|---|
| 5,894,125 A * | 4/1999 | Brener et al. | 250/330 |
| 6,816,647 B1 * | 11/2004 | Rudd et al. | 385/37 |
| 7,183,587 B2 * | 2/2007 | Negley et al. | 257/99 |
| 7,198,416 B2 * | 4/2007 | Ray et al. | 385/93 |
| 7,466,734 B1 * | 12/2008 | Day et al. | 372/39 |
| 7,529,021 B2 * | 5/2009 | Nakae et al. | 359/333 |
| 7,535,936 B2 * | 5/2009 | Day et al. | 372/20 |
| 2004/0065831 A1 * | 4/2004 | Federici et al. | 250/341.1 |
| 2006/0038168 A1 * | 2/2006 | Estes et al. | 257/25 |
| 2007/0222693 A1 | 9/2007 | Popa-Simil | |
| 2007/0228280 A1 * | 10/2007 | Mueller | 250/341.1 |
| 2007/0228355 A1 | 10/2007 | Singh | |
| 2007/0235658 A1 * | 10/2007 | Zimdars et al. | 250/390.07 |
| 2008/0203412 A1 * | 8/2008 | Shyu et al. | 257/98 |
| 2008/0224159 A1 * | 9/2008 | Krauter et al. | 257/98 |
| 2008/0258164 A1 * | 10/2008 | Masui et al. | 257/98 |
| 2009/0101823 A1 * | 4/2009 | Jez et al. | 250/341.1 |

FOREIGN PATENT DOCUMENTS

| | | |
|---|---|---|
| JP | 2007-129043 | 5/2007 |
| KR | 2002-0065801 | 8/2002 |

* cited by examiner

Primary Examiner—Ida M Soward
(74) Attorney, Agent, or Firm—Rabin & Berdo, PC

(57) ABSTRACT

There is provided a packaging apparatus of a terahertz device, the apparatus including: a terahertz device having an active region at which terahertz wave is radiated or detected; a device substrate mounting the terahertz device whose active region is positioned at an opening region formed at the center of the device substrate, and electrically connecting the terahertz device and an external terminal to each other; a ball lens block arranged and fixed to an upper part of the terahertz device; and upper and lower cases receiving the device substrate mounted with the terahertz device therein and opening region vertical upper and lower portions of the active region of the terahertz device.

12 Claims, 11 Drawing Sheets

PACKAGING APPARATUS OF TERAHERTZ DEVICE

CROSS-REFERENCE TO RELATED APPLICATIONS

This application claims the priority of Korean Patent Application No. 2007-0128991 filed on Dec. 12, 2007, in the Korean Intellectual Property Office, the disclosure of which is incorporated herein by reference.

BACKGROUND OF THE INVENTION

1. Field of the Invention

The present invention relates to a packaging apparatus of a terahertz device, and more particularly, to a packaging apparatus of a terahertz device that is realized as one independent apparatus to easily perform a characteristic test and keep and maintain the terahertz device.

This work was supported by the IT R&D program of MIC/IITA [2006-S-005-02, Development of THz-wave oscillation/modulation/detection module and signal sources technology].

2. Description of the Related Art

Terahertz (THz) wave is electromagnetic wave that is in the frequency range from 0.1 to 1 THz between microwave and infrared rays. The THz wave is in the region between existing radio wave and a light region. The region corresponds to a technical limitation of radio wave and optical technology and has been known as one of the most inaccessible regions of the electromagnetic spectrum.

However, high-power THz sources appeared with the widespread use of a femtosecond laser and the development of material technology and nano-scale processing technology, and a significant development in this field has been made.

Therefore, THz wave has attracted worldwide attention in that the THz wave will be used in various application fields in the future because of characteristics of the THz wave.

Spectroscopy and imaging techniques using inherent characteristics of the THz wave has been growing as an attractive research field as they have attracted attention from a high-tech industry and various kinds of higher-value added services, for example, a new substance, a medical service, a biotechnology, security, national defense, universe, and communication.

Further, from the fact that developed countries include techniques related to the THz wave as one of the most important future technologies, it can be expected that the THz wave has a large-scale application and a strong ripple effect.

THz wave can be divided into continuous type and pulsed type according to a generation method thereof. When THz wave is generated by a femtosecond laser, the generated THz wave belongs to pulsed THz wave type. Since the THz wave is pulse type having short durations of picoseconds or less, if the THz wave is converted into the frequency domain, ultra-wide band electromagnetic wave in the frequency range of hundreds of GHz to tens of THz can be obtained.

In general, the pulsed THz wave is generated by using a photoconductive antenna (PCA), optical rectification (OR), and a surface-field of semiconductor.

FIG. 1 is a view illustrating the concept of generating THz wave by using a photoconductive antenna.

As shown in FIG. 1, a photoconductive antenna is formed in such a way that a photoconductive thin film 11 is deposited on a semi-insulator GaAs device substrate 10 and a metal parallel transmission line (also used as an electrode) 12 having a protrusion at the center thereof is formed thereon.

Further, the protrusion formed at the center of the metal parallel transmission line 12 serves as a small dipole antenna.

While a bias voltage Vb is applied to the metal parallel transmission line 12, if the metal parallel transmission line 12 is intermittently excited by using laser pulse light fs having a time width of 100 femtoseconds or less, carriers (electrons and holes) are generated by optical absorption, a current instantaneously flows through the metal parallel transmission line 12, and THz wave (dipole radiation) in proportion to a time differentiation value of the current is generated.

That is, $$E \propto \frac{\partial i(t)}{\partial t} \propto \frac{\partial^2 P(t)}{\partial^2 t}$$

is obtained.

Here, E is a radiation electric field at a long distance (direction), i(t) is a photoconductive current, and P(t) is polarization.

THz wave is strongly radiated from the surface of a substrate having a high permittivity. The radiated THz wave has a pulse width of 1 ps or less. When light excitation is performed by using a general-purpose laser pulse of 30 fs or more, wide spectrum extending from 0 to few THz is obtained by fourier transform.

Since the small dipole antenna has a gap width of 5 μm, it is sufficiently smaller than a wavelength of the THz wave radiated at hundreds of μm. Therefore, when the current excited by optical pulse flows, it is considered that carriers move with the same phase as one group. Therefore, the THz wave being generated corresponds to coherent radiation.

As described above, the THz wave is radiated from the surface of the semiconductor. Here, the THz wave is radiated when a current is instantaneously generated by a built-in electric field existing in the semiconductor surface and when excited charges move by diffusion, which varies semiconductor materials and excitation conditions.

However, as described above, in order that the electromagnetic wave is radiated from the semiconductor surface, a high-precision alignment technology needs to be involved. This is the fundamental reason why the present invention is required.

FIG. 2 is a front view illustrating a terahertz device using a general photoconductive antenna.

Referring to FIG. 2, the terahertz device includes a photoconductive antenna-type metal pattern 21 that is formed by patterning a GA/AS device substrate and electrode pads 22 that are formed at both ends of the metal pattern 21.

As described above, the terahertz device, shown in FIG. 2, receives laser pulse light fs in which pulses of light are 100 femtoseconds long or less, generates THz wave, and radiates the THz wave to the outside.

However, since the terahertz device having the above configuration cannot be packaged as a complete device, in order to test characteristics of the device, the terahertz device needs to be electrically or mechanically connected to a test system by using a conductive adhesive or performing indium adhesion. That is, an electric line that is connected between a power supply that applies a high electric field and a contactor of the test system needs to be directly connected to the metal pattern 21 of the terahertz device.

Therefore, it is very difficult and complex to test the characteristics of the terahertz device.

Further, after the test is completed, since signal lines connected by using the conductive adhesive and indium adhesion need to be removed, the alignment of the device is skewed and contaminated. Therefore, the terahertz device cannot be reused.

Further, as described above, since the terahertz device cannot be packaged, the terahertz device is very susceptible to damage or contamination by an external environment. Therefore, it is very difficult to carry or keep the terahertz device.

SUMMARY OF THE INVENTION

An aspect of the present invention provides a packaging apparatus of a terahertz device that packages the terahertz device as one complete device to easily and simply test characteristics of the device and allows the terahertz device to be reused after the test, and kept and carried while the characteristics of the device are optimized.

According to an aspect of the present invention, there is provided a packaging apparatus of a terahertz device, the apparatus including: a terahertz device having an active region at which terahertz wave is radiated or detected; a device substrate mounting the terahertz device whose active region is positioned at an opening region formed at the center of the device substrate, and electrically connecting the terahertz device and an external terminal to each other; a ball lens block arranged and fixed to an upper part of the terahertz device; and upper and lower cases receiving the device substrate mounted with the terahertz device therein and opening region vertical upper and lower portions of the active region of the terahertz device.

The packaging apparatus may further include upper and lower caps connected to the upper and lower cases to seal opening regions of the upper and lower cases, respectively.

The terahertz device may include: a GA/AS device substrate having a square shape; a photoconductive antenna-type metal pattern formed by patterning the GA/AS device substrate; electrode pads separately formed at ends of the metal pattern; and auxiliary bonding pads separately formed at edges of the GA/AS device substrate.

The ball lens block may include a ball lens having a hemispherical shape; and a sleeve having a cylindrical shape to encompass an outer circumference of the ball lens and fixing the ball lens. The ball lens and the sleeve may be integrated into a chip by epoxy adhesion.

The device substrate may include a stacked ceramic board having an opening region at the center thereof; first contact pads formed on the ceramic board at positions at which the first contact pads correspond to the electrode pads of the terahertz device; second contact pads formed on the ceramic board at positions at which the second contact pads correspond to the auxiliary bonding pads of the terahertz device; a hole pattern formed at one side of the ceramic board to connect the external terminal thereto; and signal lines patterned onto the ceramic board to electrically connect the first contact pads and the hole pattern to each other.

The first and second contact pads may be formed at a top layer of the ceramic board, and the signal lines may be formed at a bottom layer of the ceramic board.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
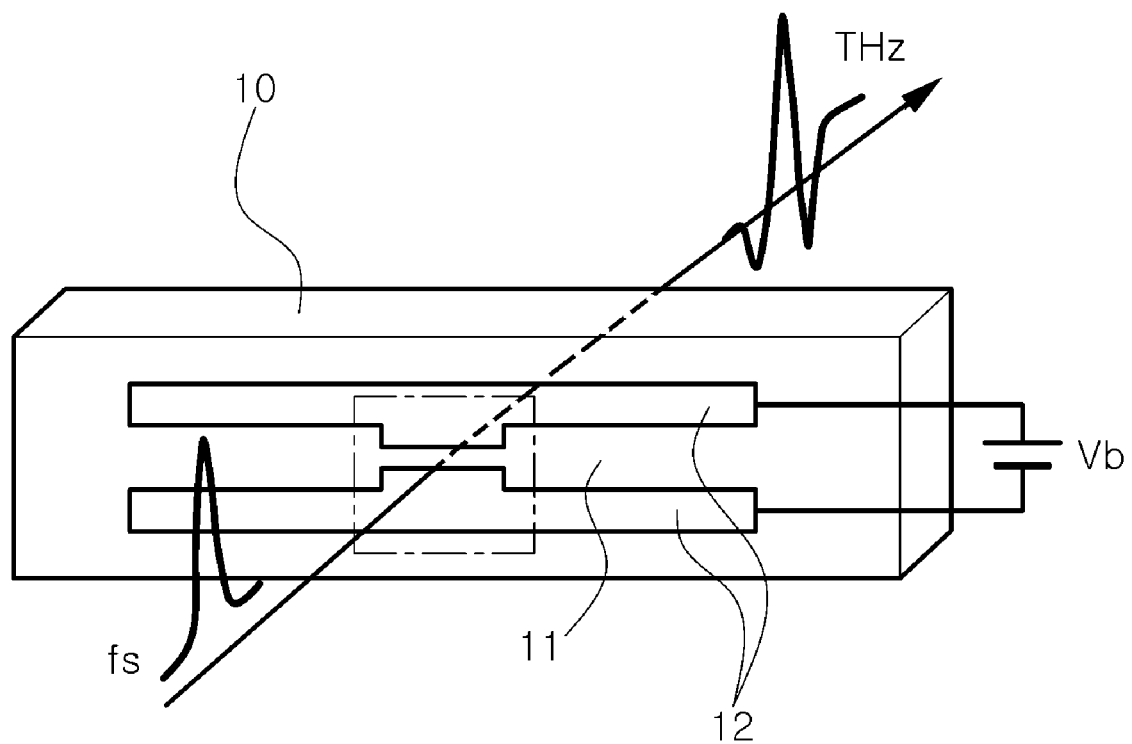
FIG. 1 is view illustrating the concept of generating terahertz wave by using a photoconductive antenna.

Hereinafter, exemplary embodiments of the present invention will now be described in detail with reference to the accompanying drawings. However, in description of operation principles associated with the embodiments of the present invention, detailed description of a known art or configuration is omitted because it may obscure the spirit of the present invention unnecessarily. In the following description, well-known functions or configurations are not described in detail since they would obscure the invention in unnecessary detail.

Also, in the drawings, the same reference numerals are used throughout to designate the same or similar components.

Figure 3:
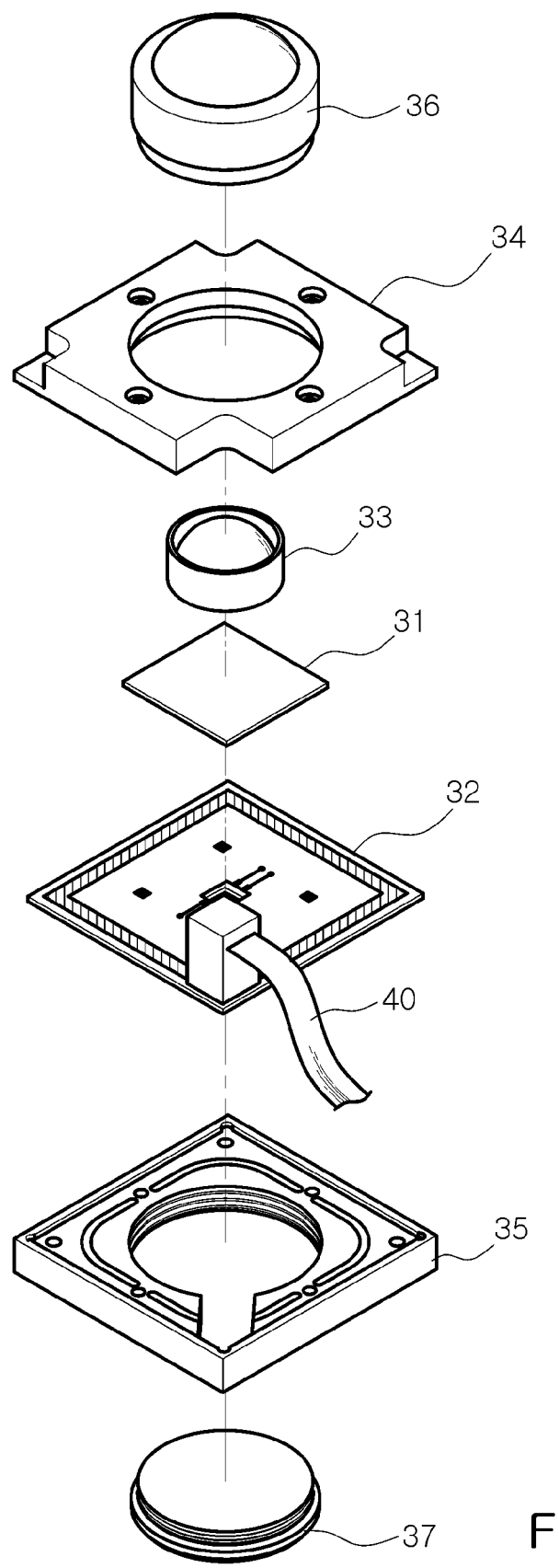
FIG. 3 is an exploded perspective view illustrating a configuration of a packaging apparatus of a terahertz device according to an exemplary embodiment of the present invention.
Figure 4:
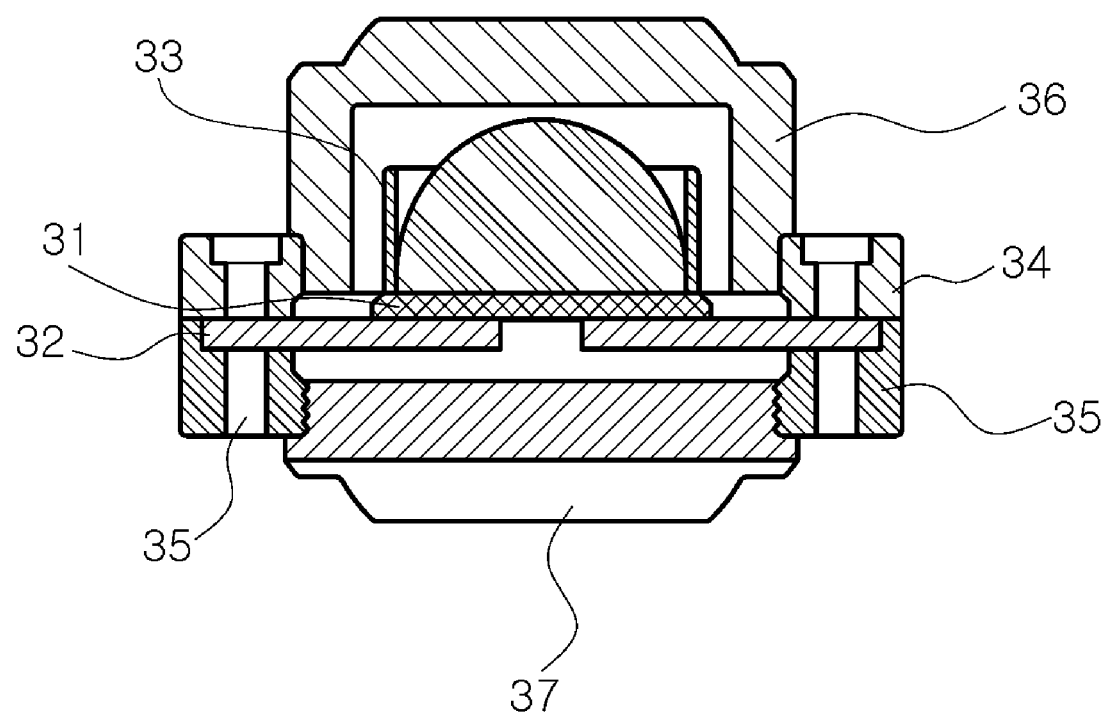
FIG. 4 is a side view illustrating the configuration of the packaging apparatus of a terahertz device according to the exemplary embodiment of the present invention.

FIG. 3 is an exploded perspective view illustrating a configuration of a packaging apparatus of a terahertz device according to an exemplary embodiment of the invention. FIG. 4 is a side view illustrating the configuration of the packaging apparatus of the terahertz device according to the exemplary embodiment of the invention.

Figure 2:
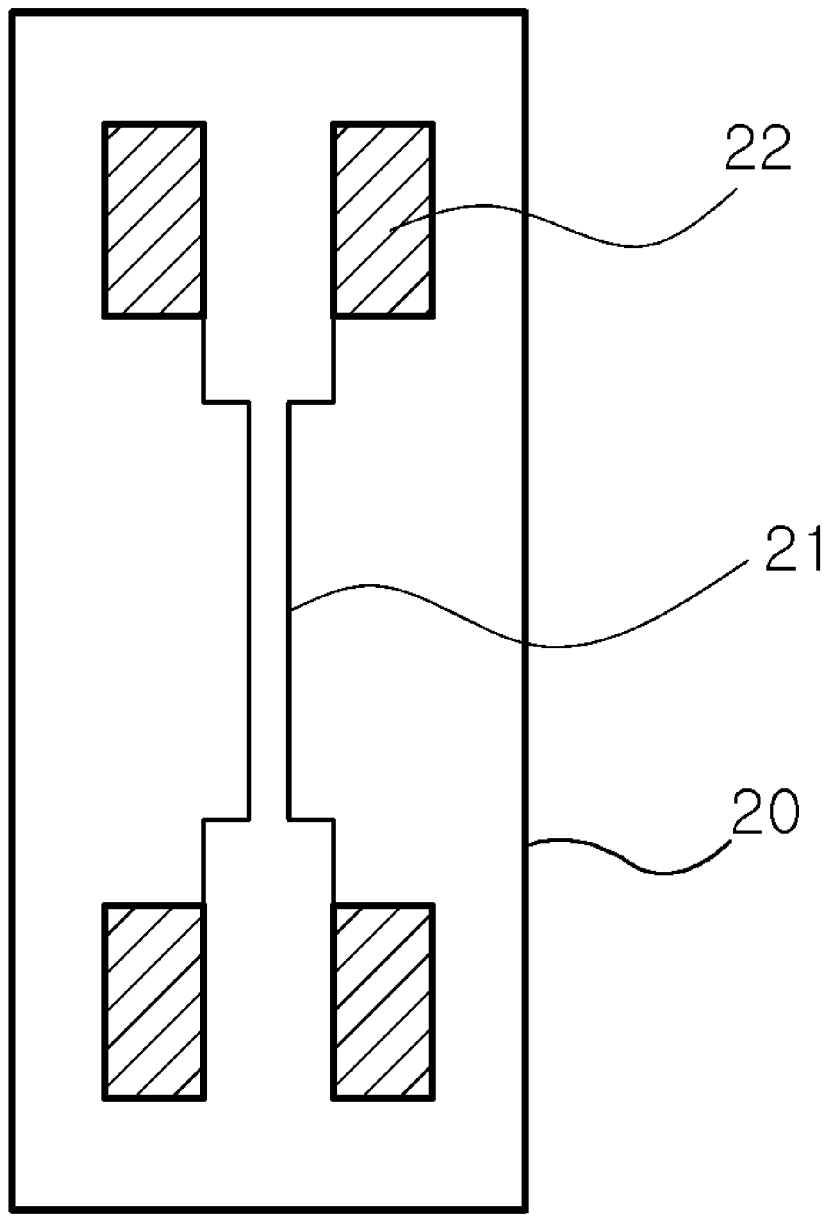
FIG. 2 is a front view illustrating a terahertz device using a general photoconductive antenna.

Referring to FIGS. 3 and 4, the packaging apparatus according to the exemplary embodiment of the invention performs the same operation as the terahertz device shown in FIG. 2. Further, the packaging apparatus includes a terahertz device 31, a device substrate 32, a ball lens block 33, and upper and lower cases 34 and 35.

The terahertz device 31 includes an active region at which THz wave is radiated or detected. The terahertz device 31 is mounted to the device substrate 32 so that the active region of the terahertz device 31 is positioned at an opening region formed at the center of the device substrate 32. The device substrate 32 electrically connects the terahertz device 31 and an external terminal 40 to each other. The ball lens block 33 is arranged and fixed to an upper part of the terahertz device 31. The upper and lower cases 34 and 35 receive the device substrate 32 mounted with the terahertz device 31 therein, and at the same time, open vertical upper and lower portions of the active region of the terahertz device 31.

As such, the packaging apparatus according to the embodiment of the invention packages the terahertz device 31 and electrically connects the terahertz device 31 and the external terminal 40 that is connected to an external measurement system, such as a test system.

Further, regions of the device substrate 32, the upper case 34, and the lower case 35 that correspond to the vertical upper and lower portions of the active region of the terahertz device 31 are all opened, such that laser pulse light fs is directly irradiated onto the terahertz device 31 and terahertz (THz) wave generated by the terahertz device 31 can be radiated to the outside.

And, when the packaging apparatus of the terahertz device is kept and carried, in order to completely seal the terahertz device 31, upper and lower caps 36 and 37 that are connected to the upper and lower cases 34 and 35 and seal opening regions of the upper and lower cases 34 and 35, respectively, may be further included.

Preferably, the upper cap 36 may have the shape of a cup that has an opened bottom and a closed top to receive the ball lens block 33 therein.

Hereinafter, a method of packaging a terahertz device will be described.

First, the terahertz device 31 is realized, the device substrate 32 to which the terahertz device 31 is mounted and the external terminal 40 can be connected is realized, and the terahertz device 31 and the device substrate 32 are bonded to each other by high-precision alignment using a stencil mask or the like and conductive epoxy adhesion.

The ball lens block 33 is formed by integrating a ball lens having a hemispherical shape and a sleeve having a cylindrical shape into a chip by the epoxy adhesion. The ball lens block 33 is arranged and fixed to a top surface of the terahertz device 31 by epoxy adhesion with high precision.

Figure 5:
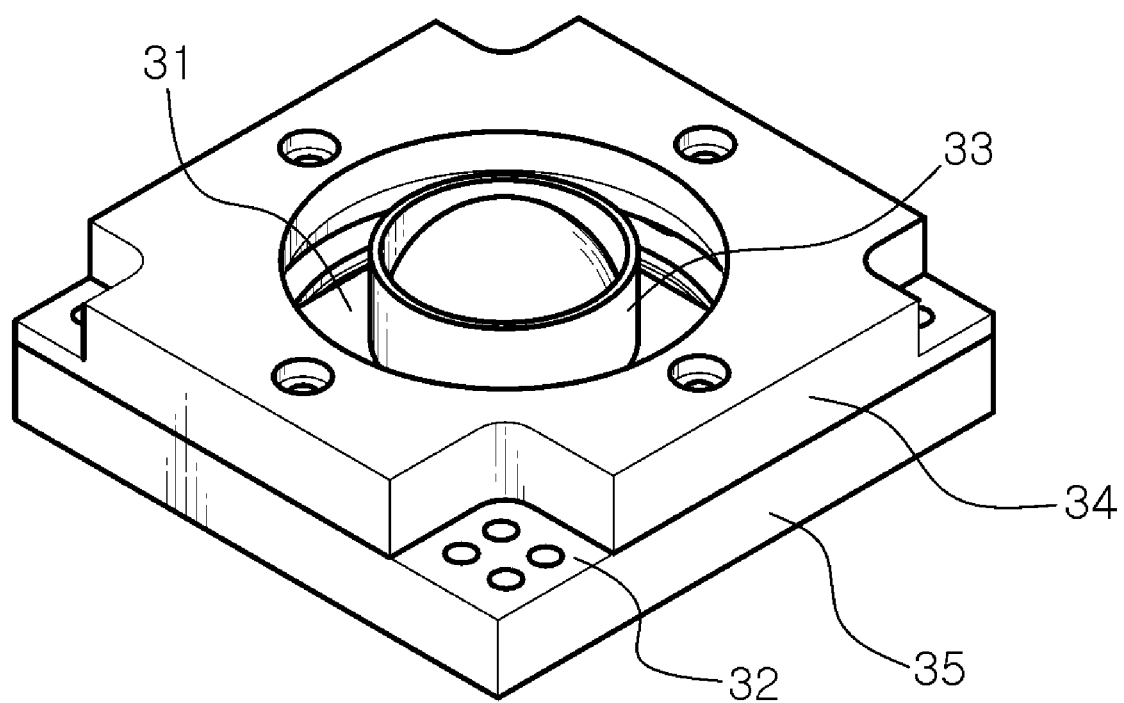
FIG. 5 is a view illustrating the terahertz device and the packaging apparatus coupled to each other according to the exemplary embodiment of the present invention.

The upper and lower cases 34 and 35 are positioned at front and rear surfaces, respectively, of the device substrate 32, and fixing bolts are inserted through coupling holes of the cases 34 and 35, thereby realizing the packaging apparatus of the terahertz device that has the configuration as shown in FIG. 5.

In order to test the terahertz device according to the embodiment of the invention, a packaging apparatus of a terahertz device that has the configuration, shown in FIG. 5, is realized. In order to keep or carry the terahertz device, the opening regions of the upper and lower cases 34 and 35 are sealed by the upper and lower caps 36 and 37, respectively.

As such, the packaging apparatus of the terahertz device according to the embodiment of the invention allows the connection of the external terminal 40 and provides an electrical and mechanical connection between a measurement system and the terahertz device by the external terminal 40.

As a result, since the conductive adhesive or the indium adhesion is not required for the test like the related art, the test can be easily and simply performed, and time and cost required to perform the test can be significantly reduced.

Further, the packaging apparatus according to the embodiment of the invention seals the terahertz device by the upper and lower cases 34 and 35 and the upper and lower caps 36 and 37 to thereby minimize the effects caused by an external environment. Therefore, the terahertz device can be carried and kept more easily.

Figure 6:
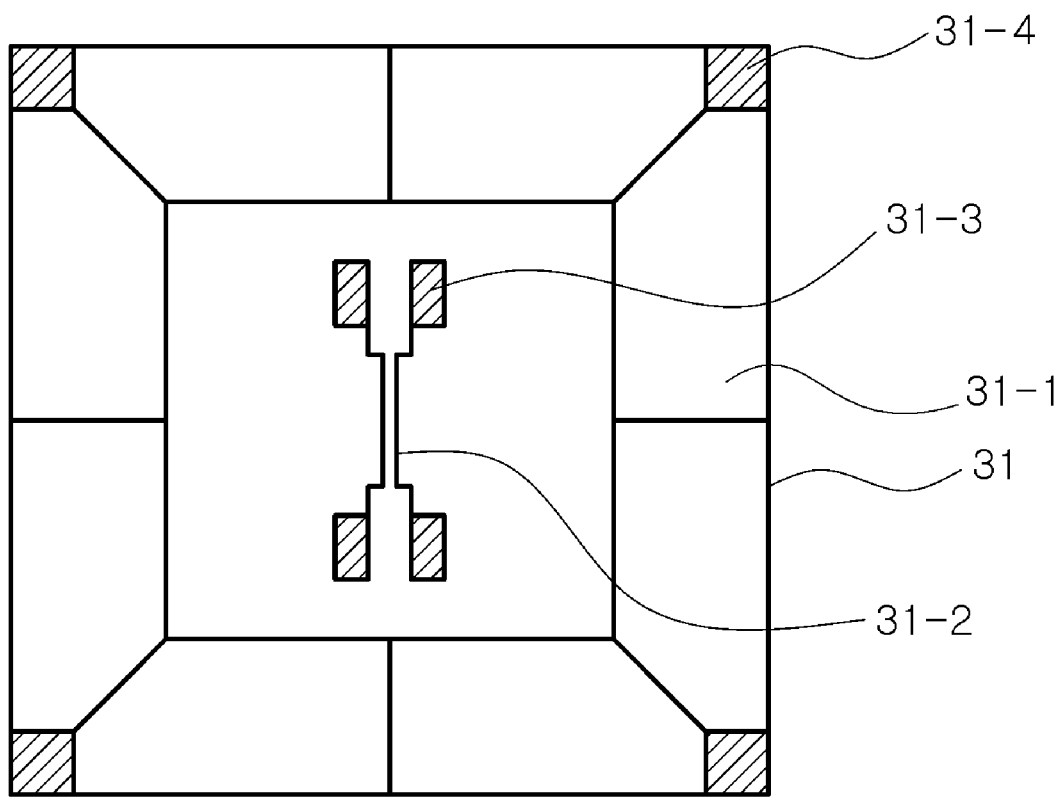
FIG. 6 is a plan view illustrating a configuration of the terahertz device according to an exemplary embodiment of the present invention.

FIG. 6 is a front view illustrating a configuration of a terahertz device according to an exemplary embodiment of the present invention.

Referring to FIG. 6, the terahertz device 31 includes a square GA/AS device substrate 31-1, a photoconductive antenna-type metal pattern 31-2, electrode pads 31-3, and auxiliary bonding pads 31-4.

And, the metal pattern 31-2 is formed by patterning the GA/AS device substrate 31-1. The electrode pads 31-3 are individually formed at ends of the metal pattern 31-2 and each apply a bias voltage. The auxiliary bonding pads 31-4 are formed at the edges of the GA/AS device substrate to stably bond the device substrate 32.

In the embodiment of the invention, the terahertz device 31 has a square shape. In this way, when the terahertz device 31 and the ball lens block 33 are bonded to each other, the terahertz device 31 can be prevented from being bent due to a physical force from the outside by uniformly dispersing the physical force to be applied when bonding the ball lens block 33 to the terahertz device 31.

That is, the bending caused by the external physical force is prevented as much as possible, such that the ball lens block 33 can be completely in surface contact with and aligned with the terahertz device 31.

If the terahertz device 31 has a rectangular shape, when a physical force is applied, a force is ununiformly dispersed, and thus, both sides of the terahertz device 31 that are longer than the other sides are bent. As a result, a predetermined gap occurs between the terahertz device 31 and the ball lens block 33. Due to the gap, it is difficult for the ball lens block 33 to be in surface contact with and aligned with the terahertz device 31.

Figure 7:
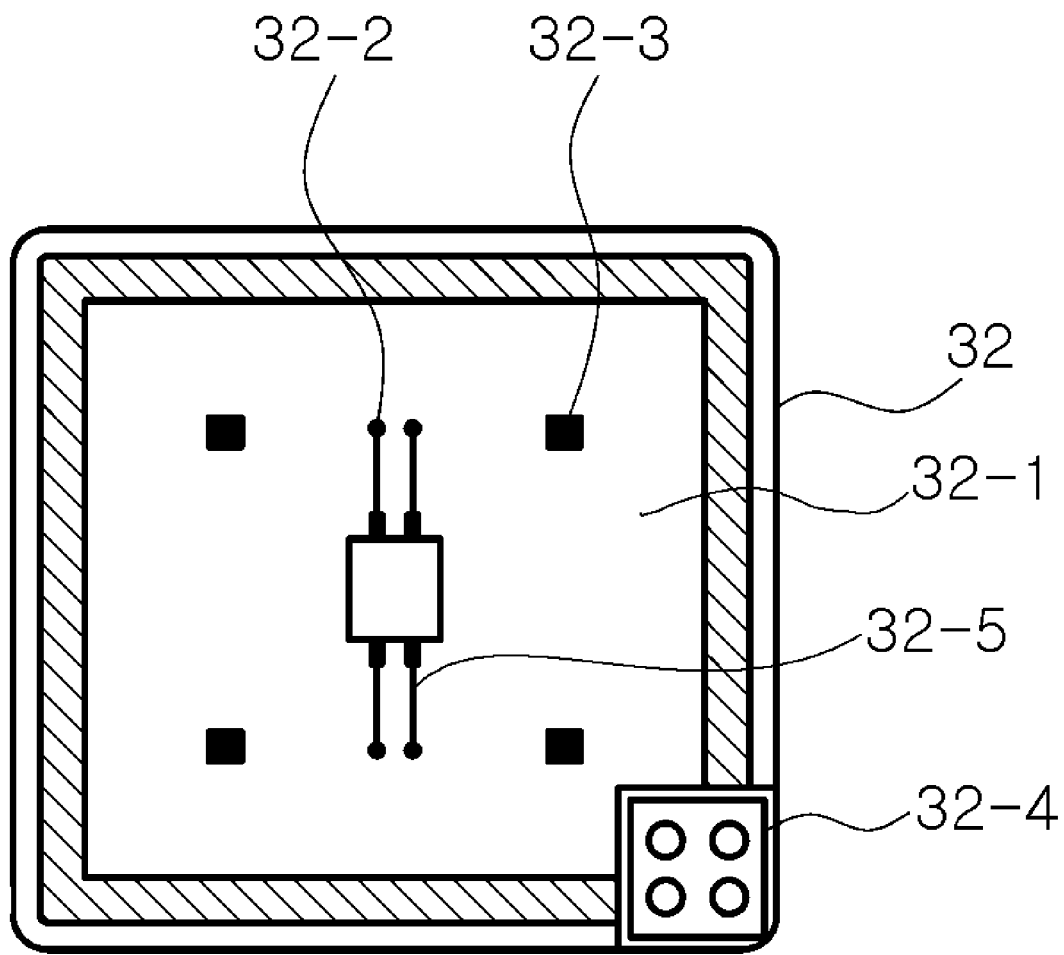
FIG. 7 is a front view illustrating a configuration of a device substrate according to an exemplary embodiment of the present invention.

FIG. 7 is a front view illustrating the configuration of a device substrate according to an exemplary embodiment of the present invention.

Referring to FIG. 7, the device substrate 32 includes a stacked ceramic board 32-1, first contact pads 32-2, second contact pads 32-3, a hole pattern 32-4, and signal lines 32-5.

And, the ceramic board 32-1 has an opening region at the center thereof. The first contact pads 32-2 are formed at positions corresponding to the electrode pads 31-3 of the terahertz device 31 and connected to the electrode pads 31-3. The second contact pads 32-3 are formed at positions corresponding to the auxiliary bonding pads 31-4 of the terahertz device 31 to more stably perform the bonding between the terahertz device 31 and the device substrate 32. The hole pattern 32-4 is formed at the edge of the device substrate 32 so that the external terminal 40, such as a BNC connector, can be connected. The signal line 32-5 are formed by patterning metal to electrically connect the first contact pads 32-2 and the hole pattern 32-4.

Preferably, the first and second contact pads 32-2 and 32-3 that are electrically connected to the electrode pads 31-3 and the auxiliary bonding pads 31-4 of the terahertz device 31 are formed at the top layer of the device substrate 32, while the signal lines 32-5 that are used to electrically connect the first contact pads 32-2 and the hole pattern 32-4 are formed at the bottom layer of the device substrate 32.

Figure 8:
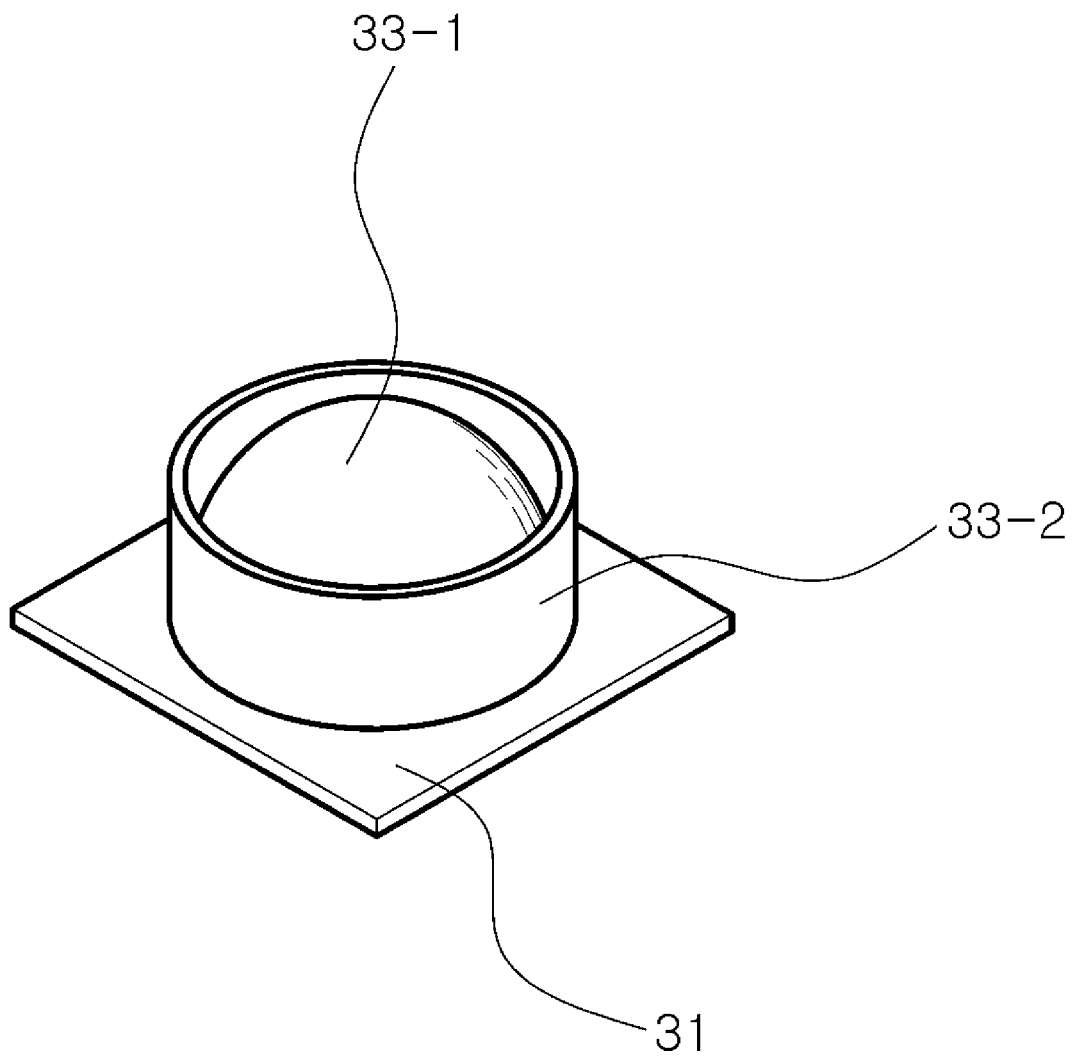
FIG. 8 is a side view illustrating a configuration of a ball lens block bonded to the terahertz device according to an exemplary embodiment of the present invention.

FIG. 8 is a side view illustrating a configuration of a ball lens block connected to the terahertz device according to the exemplary embodiment of the present invention.

Referring to FIG. 8, the ball lens block 33 includes a ball lens 33-1 and a sleeve 33-2. The ball lens 33-1 has a hemispherical shape. The sleeve 33-2 has a cylindrical shape to encompass an outer circumference of the ball lens 33-1 so that the ball lens 33-1 is fixed. The ball lens 33-1 and the sleeve 33-2 are integrated into a chip.

The ball lens block 33 is fixed to a front surface of the terahertz device 31 so that the ball lens 33-1 is positioned on the photoconductive antenna-type metal pattern 31-2 of the terahertz device 31.

At this time, the ball lens has the hemispherical shape so that THz wave that is generated by the terahertz device 31 and diffused is combined to radiate the combined THz wave in a linear fashion.

Figure 9:
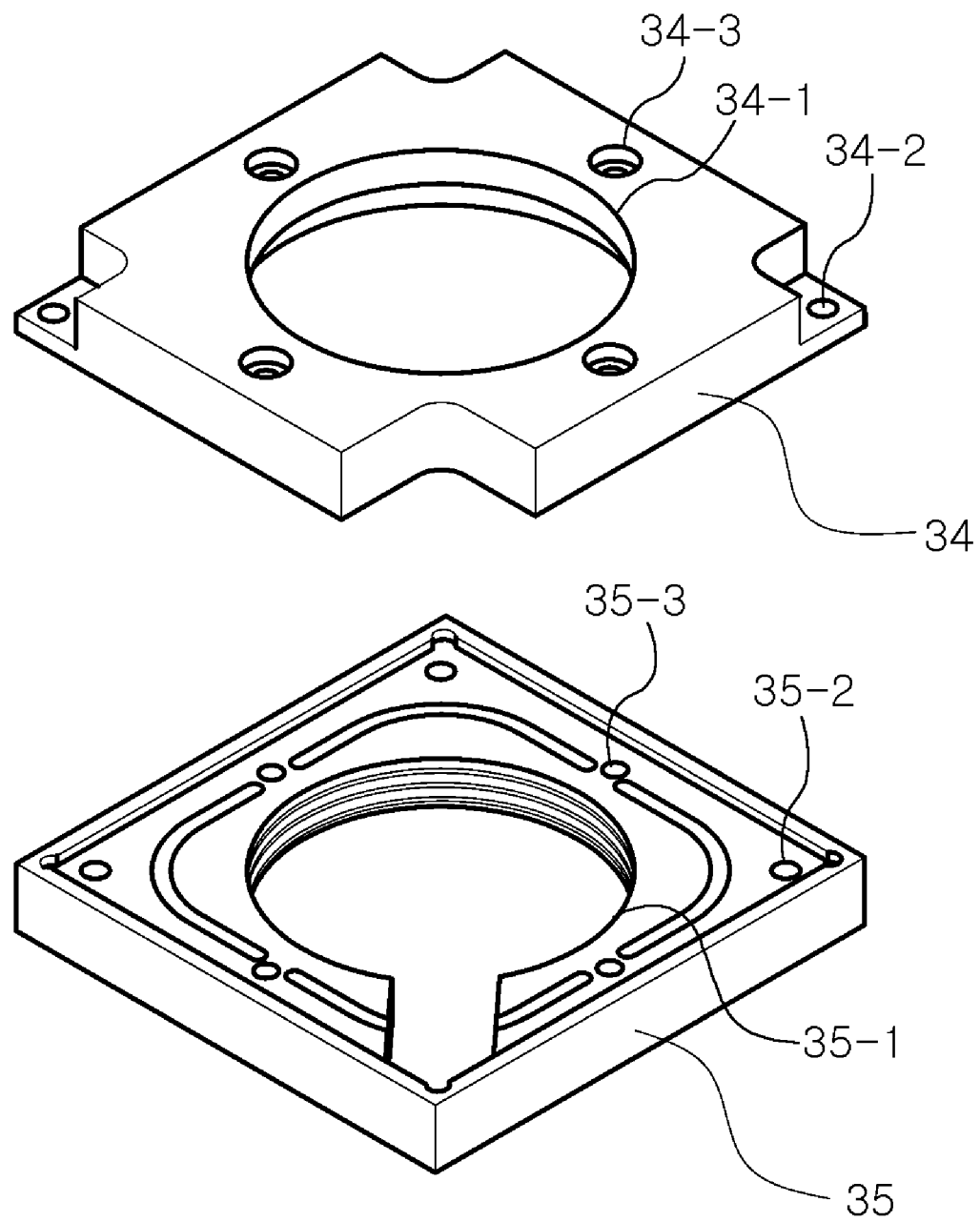
FIG. 9 is a perspective view illustrating configurations of upper and lower cases of the terahertz device according to an exemplary embodiment of the present invention.

FIG. 9 is a perspective view illustrating the configurations of the upper and lower cases of the terahertz device according to the exemplary embodiment of the present invention.

Referring to FIG. 9, the upper case 34 includes an opening region 34-1 and a plurality of first and second upper coupling holes 34-2 and 34-3.

The opening region 34-1 is formed in an upper part of the active region of the terahertz device 31. The plurality of first and second upper coupling holes 34-2 and 34-3 are formed at an outer edge of the upper case 34 to induce engagement with the lower case 35 and fix the device substrate 32.

The lower case 35 includes an opening region 35-1 and a plurality of first and second lower coupling holes 35-2 and 35-3. The opening region 35-1 is formed in the lower part of the active region of the terahertz device 31. The plurality of first and second lower coupling holes 35-2 and 35-3 are formed at the outer edge of the lower case 35 to induce engagement with the upper case 34 and fix the device substrate 32.

The upper case 34 and the lower case 35 are coupled to each other by inserting the fixing bolts through the upper coupling holes 34-2 and the lower coupling holes 35-2 to thereby form one case unit that receives the device substrate 32 having the terahertz device 31 therein and opens the active region of the terahertz device 31.

Figure 10:
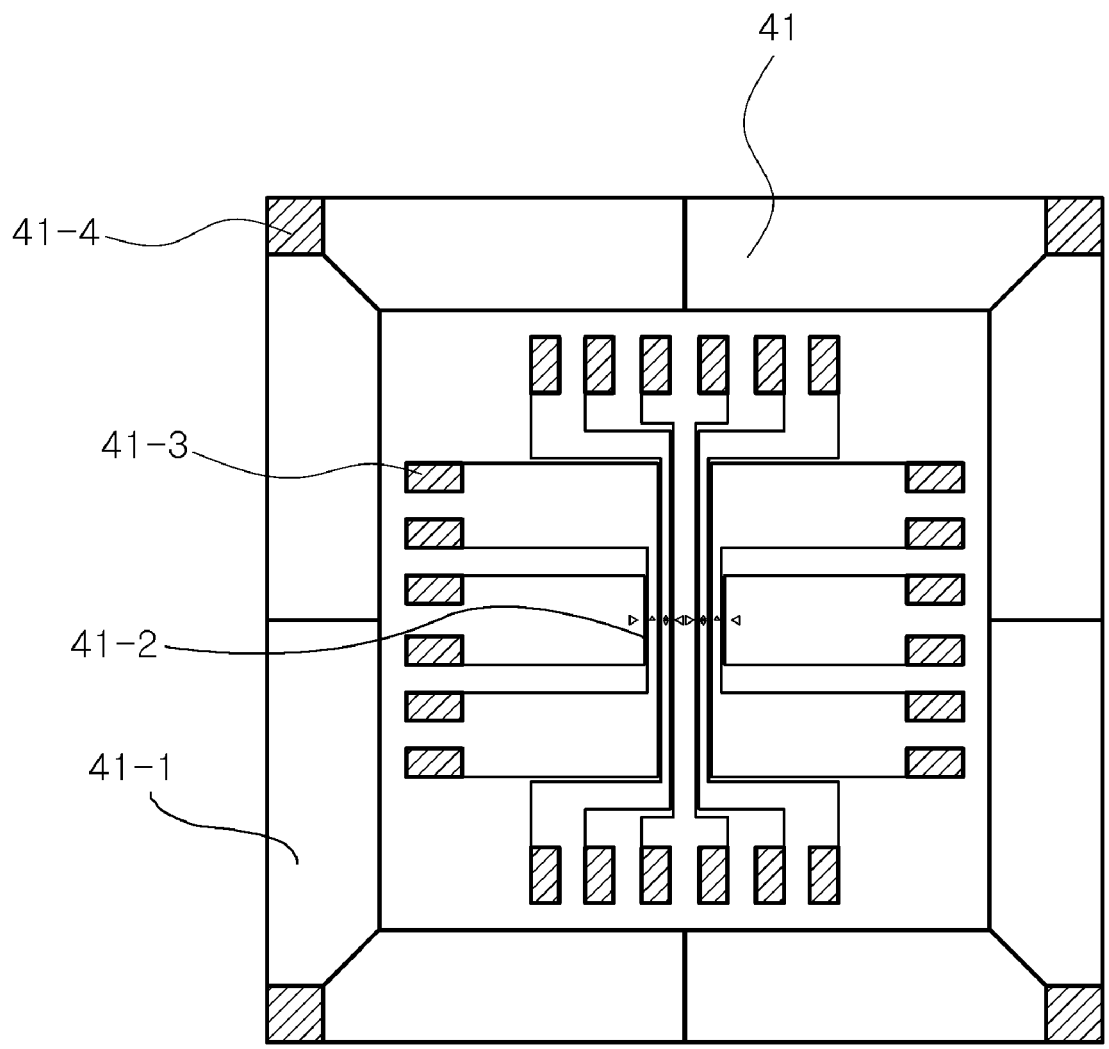
FIG. 10 is a plan view illustrating a configuration of a terahertz device according to another exemplary embodiment of the present invention.

As described above, the description of the packaging apparatus and method of the terahertz device has been made of a case in which the one photoconductive antenna-type metal pattern is only formed. However, as shown in FIG. 10, a plurality of photoconductive antenna-type metal patterns may be formed in the terahertz device.

Figure 11:
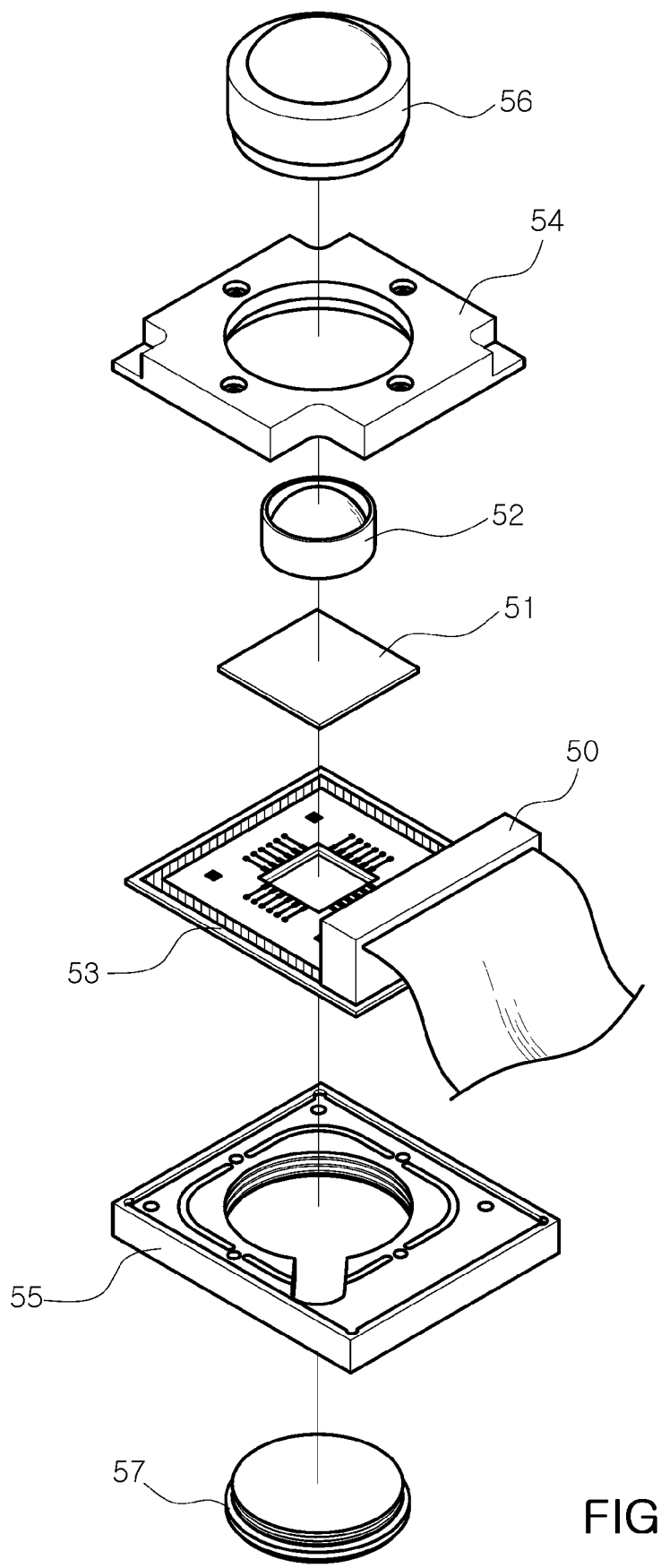
FIG. 11 is an exploded perspective view illustrating a packaging apparatus of a terahertz device according to another exemplary embodiment of the present invention.

In this case, as show in FIG. 11, a device substrate 53 has one entire side surface at which an external terminal connecting portion is formed, such that an external terminal 50 having a larger number of pins can be mounted to the device substrate 53.

As set forth above, according to exemplary embodiments of the invention, the packaging apparatus of the terahertz device packages the terahertz device as one complete device such that the terahertz device can be kept and carried while the characteristics of the device are optimized.

Further, an external terminal connecting portion is separately provided so that an external terminal, such as a BNC connector, can be connected thereto. Therefore, an external apparatus, such as a test system, can be more easily connected by the external terminal. Therefore, the test on the terahertz device can be more easily and simply performed, and the terahertz device can be reused after the test.

While the present invention has been shown and described in connection with the exemplary embodiments, it will be apparent to those skilled in the art that modifications and variations can be made without departing from the spirit and scope of the invention as defined by the appended claims.

What is claimed is:

1. A packaging apparatus of a terahertz device, the apparatus comprising:
a terahertz device having an active region at which terahertz wave is radiated or detected;
a device substrate mounting the terahertz device whose active region is positioned at an opening region, in which an aperture is provided in the device substrate, formed at the center of the device substrate, and electrically connecting the terahertz device and an external terminal to each other;
a ball lens block arranged and fixed to an upper part of the terahertz device; and
upper and lower cases receiving the device substrate mounted with the terahertz device therein and opening region vertical upper and lower portions of the active region of the terahertz device,
wherein the device substrate includes:
a antenna-type metal pattern formed by patterning the device substrate; and
electrode pads individually formed at ends of the metal pattern.

2. The packaging apparatus of claim 1, further comprising upper and lower caps connected to the upper and lower cases to seal opening regions of the upper and lower cases, respectively.

3. The packaging apparatus of claim 1, wherein the ball lens block comprises:
a ball lens having a hemispherical shape; and
a sleeve having a cylindrical shape to encompass an outer circumference of the ball lens and fixing the ball lens.

4. The packaging apparatus of claim 3, wherein the ball lens and the sleeve are integrated into a chip by epoxy adhesion.

5. The packaging apparatus of claim 1, further comprising auxiliary bonding pads individually formed at edges of the device substrate.

6. A packaging apparatus of a terahertz device, the apparatus comprising:
a terahertz device having an active region at which terahertz wave is radiated or detected;
a device substrate mounting the terahertz device whose active region is positioned at an opening region formed at the center of the device substrate, and electrically connecting the terahertz device and an external terminal to each other;
a ball lens block arranged and fixed to an upper part of the terahertz device; and
upper and lower cases receiving the device substrate mounted with the terahertz device therein and opening region vertical upper and lower portions of the active region of the terahertz device,
wherein the terahertz device includes:
a GA/AS device substrate having a square shape;
a photoconductive antenna-type metal pattern formed by patterning the GA/AS device substrate;
electrode pads separately formed at ends of the metal pattern; and
auxiliary bonding pads separately formed at edges of the GA/AS device substrate.

7. The packaging apparatus of claim 6, wherein the ball lens block comprises:
a ball lens having a hemispherical shape; and
a sleeve having a cylindrical shape to encompass an outer circumference of the ball lens and fixing the ball lens.

8. The packaging apparatus of claim 7, wherein the ball lens and the sleeve are integrated into a chip by epoxy adhesion.

9. A packaging apparatus of a terahertz device, the apparatus comprising:
a terahertz device having an active region at which terahertz wave is radiated or detected;

a device substrate mounting the terahertz device whose active region is positioned at an opening region formed at the center of the device substrate, and electrically connecting the terahertz device and an external terminal to each other;

a ball lens block arranged and fixed to an upper part of the terahertz device; and upper and lower cases receiving the device substrate mounted with the terahertz device therein and opening region vertical upper and lower portions of the active region of the terahertz device, wherein the device substrate comprises:

a stacked ceramic board having an opening region at the center thereof;

first contact pads formed on the ceramic board at positions at which the first contact pads correspond to the electrode pads of the terahertz device;

second contact pads formed on the ceramic board at positions at which the second contact pads correspond to the auxiliary bonding pads of the terahertz device;

a hole pattern formed at one side of the ceramic board to connect the external terminal thereto; and signal lines patterned onto the ceramic board to electrically connect the first contact pads and the hole pattern to each other.

10. The packaging apparatus of claim 9, wherein the first and second contact pads are formed at a top layer of the ceramic board, and the signal lines are formed at a bottom layer of the ceramic board.

11. The packaging apparatus of claim 9, wherein the ball lens block comprises:

a ball lens having a hemispherical shape; and a sleeve having a cylindrical shape to encompass an outer circumference of the ball lens and fixing the ball lens.

12. The packaging apparatus of claim 11, wherein the ball lens and the sleeve are integrated into a chip by epoxy adhesion.

* * * * *